United States Patent
Mobley

(10) Patent No.: US 6,501,698 B1
(45) Date of Patent: Dec. 31, 2002

(54) STRUCTURE AND METHOD FOR HIDING DRAM CYCLE TIME BEHIND A BURST ACCESS

(75) Inventor: Kenneth J. Mobley, Colorado Springs, CO (US)

(73) Assignee: Enhanced Memory Systems, Inc., Colorado Springs, CO (US)

( * ) Notice: Subject to any disclaimer, the term of this patent is extended or adjusted under 35 U.S.C. 154(b) by 8 days.

(21) Appl. No.: 09/703,765

(22) Filed: Nov. 1, 2000

(51) Int. Cl.$^7$ .................................................. G11C 7/00
(52) U.S. Cl. .................. 365/221; 365/230.01; 365/239; 365/189.05; 365/222; 365/230.03
(58) Field of Search ........................... 365/221, 230.01, 365/239, 189.05, 222, 230.03

(56) References Cited

U.S. PATENT DOCUMENTS

| | | | | |
|---|---|---|---|---|
| 5,371,708 A | * | 12/1994 | Kobayashi | ................... 365/221 |
| 5,644,537 A | * | 7/1997 | Toda | ..................... 365/189.05 |
| 5,694,143 A | * | 12/1997 | Fielder et al. | ............... 345/112 |
| 5,699,317 A | | 12/1997 | Sartore et al. | ......... 365/230.06 |
| 5,721,862 A | | 2/1998 | Sartore et al. | .............. 395/445 |
| 5,761,150 A | * | 6/1998 | Yukutake et al. | ............ 365/233 |
| 5,835,436 A | * | 11/1998 | Ooishi | .................... 365/230.03 |
| 5,887,272 A | | 3/1999 | Sartore et al. | .............. 711/105 |
| 6,067,260 A | | 5/2000 | Ooishi et al. | |
| 6,069,639 A | * | 5/2000 | Takasugi | ..................... 345/534 |
| 6,144,615 A | * | 11/2000 | Toda | ..................... 365/230.03 |
| 6,262,939 B1 | * | 7/2001 | Matsui | ........................ 365/233 |

* cited by examiner

*Primary Examiner*—Richard Elms
*Assistant Examiner*—Van Thu Nguyen
(74) *Attorney, Agent, or Firm*—William J. Kubida, Esq.; Peter J. Meza, Esq.; Hogan & Hartson, LLP

(57) ABSTRACT

A method and system for hiding DRAM cycle time behind burst read and write accesses. A combined read and write data transfer area interacts with a set of sense amplifiers to accelerate read and write cycles. By independently isolating the read data transfer areas and the write data transfer areas, data can be transferred (1) from the DRAM array to the read data transfer areas, (2) from the write data transfer areas to the DRAM array, and (3) from the write data transfer areas to the read data transfer areas.

17 Claims, 8 Drawing Sheets

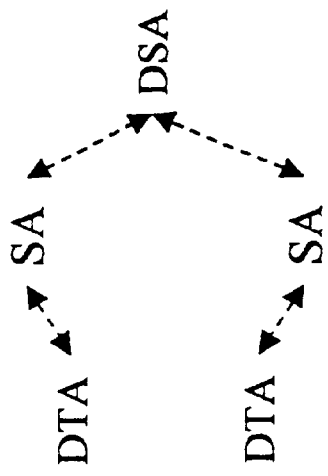
Fig. 4C
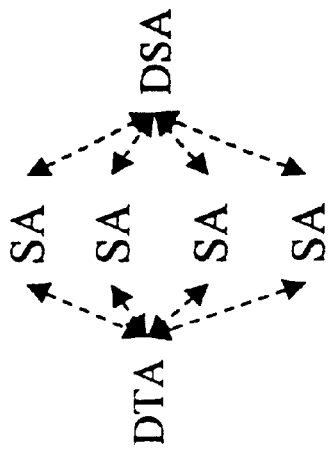
Fig. 4B
1-to-1,
1-to-many
many-to-1, and
many-to-many
1-to-1,
1-to-many
many-to-1, and
many-to-many
DTA - - - → SA ← - - - → DSA
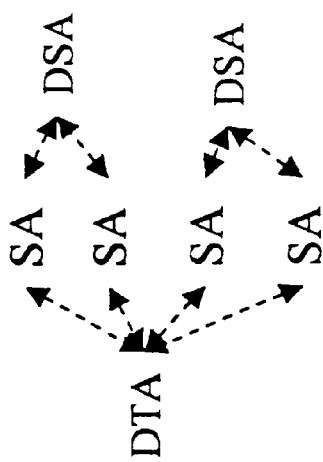
Fig. 4D
Fig. 4E

| Fig. 4F-1 | Fig. 4F-2 |

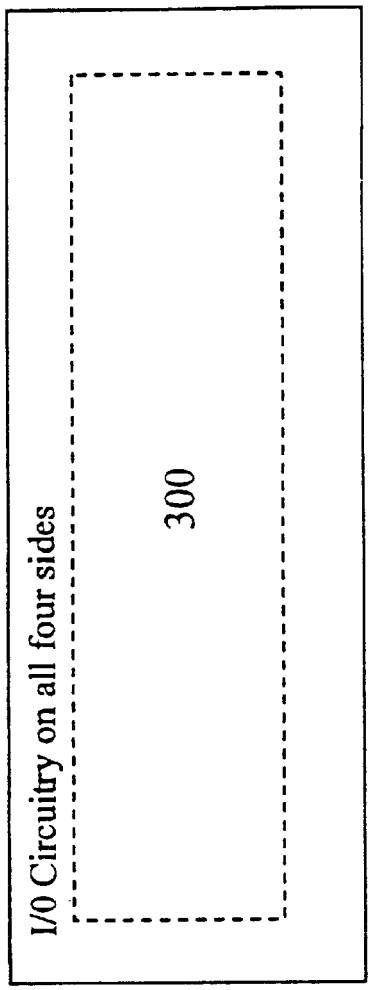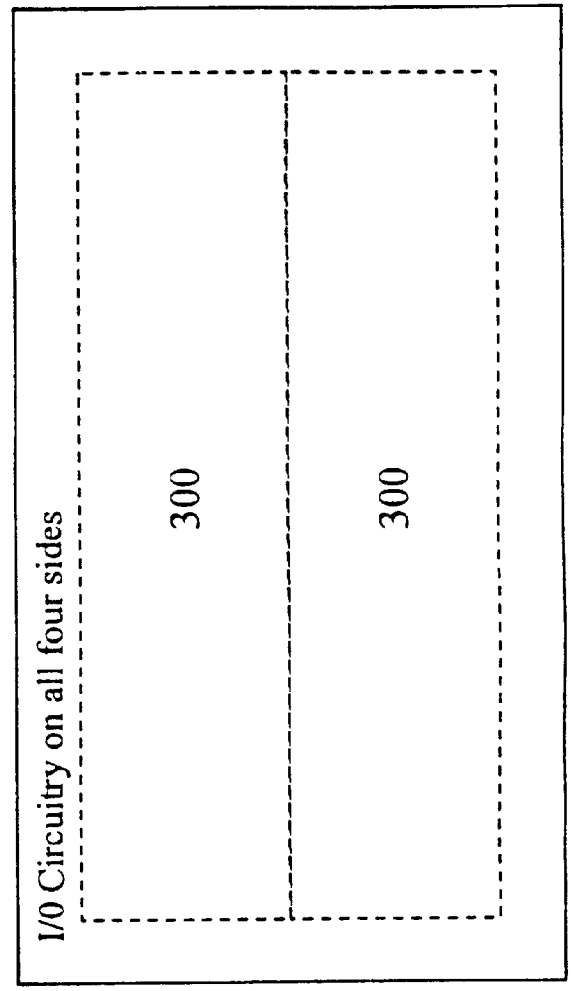

STRUCTURE AND METHOD FOR HIDING DRAM CYCLE TIME BEHIND A BURST ACCESS

BACKGROUND OF THE INVENTION

1. Field of the Invention

A method and device for providing increased access speed to a DRAM array-based memory device, and more particularly to a DRAM array-based memory device including a data transfer area that accelerates read and write requests.

2. Discussion of the Background

A variety of memory devices are presently available with varying physical characteristics. Dynamic Random Access Memory (DRAM) has the advantage that the number of gates per cell is small and the density is generally quite high. On the other hand, DRAM is disadvantageously prone to data loss if the individual rows of data are not periodically refreshed. Accordingly, known systems have used external or internal refresh circuitry to prevent data loss. External circuitry complicates the design of an external memory controller and may therefore be disadvantageous. DRAMs disadvantageously have relatively long access times as compared to other memory devices (e.g., static memories) and therefore may act as a bottleneck for a processor that requests memory accesses more quickly than the DRAM can sustain.

As an alternative, Static Random Access Memory (SRAM) devices utilize a greater number of transistors per memory cell and, as a result, do not require refreshing. Moreover, the transistor interconnections allow data to be read from and written to the device significantly more quickly than DRAMs. Unfortunately, the cost of SRAMs per bit is significantly more expensive than the cost of DRAMs per bit. Accordingly, it is often prohibitively expensive to use SRAM for a computer's main memory, and instead a relatively small amount of SRAM cache is often used only between the processor and a larger amount of DRAM.

As an alternative to both DRAM and SRAM designs, hybrid memories have been introduced that have some of the characteristics of both DRAM devices and SRAM devices. One such device is known as an "Enhanced DRAM" (EDRAM) and is described in U.S. Pat. Nos. 5,887,272, 5,721,862, and 5,699,317 (hereinafter "the '272 patent," "the '862 patent", and "the '317 patent," respectively), each naming Sartore et al. as inventors. (Those patents also are assigned to the assignee of the present invention and incorporated herein by reference.) The EDRAM devices disclosed therein provide increased data throughput by providing at least one higher speed storage area (as compared to the DRAM sub-array), storing at least a portion of a row, associated with each DRAM sub-array or with each group (e.g., pair) of DRAM sub-arrays.

Another hybrid memory device, that provides double buffering for writes, is described in U.S. Pat. No. 5,784,705 (hereinafter "the '705 patent") to Leung, assigned at the time of issue to MoSys, Inc., of Sunnyvale, Calif., and incorporated herein by reference. The abstract of the '705 patent discloses that its memory architecture uses a write buffer that is a "two entry write buffer in a first in, first out manner." FIG. 7 of the '705 patent illustrates a double buffering circuit.

BRIEF SUMMARY OF THE INVENTION

It is an object of the present invention to provide a structure and method for hiding DRAM cycle time behind a burst write access.

It is a further object of the present invention to provide a structure and method for hiding DRAM cycle time behind both burst write accesses and burst read accesses.

These objects and other advantages are made possible by using read and write data transfer areas in an augmented Dynamic Random Access Memory (DRAM) device. By providing fast write access to the write data transfer areas, burst writes can be completed at SRAM-like write speeds. The contents of the write data transfer areas are then later retired to the DRAM memory array at speeds compatible with the underlying DRAM array.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4B is a schematic illustration of a general memory architecture according to the present invention;

FIG. 4C is a schematic illustration of a first exemplary memory architecture according to the general architecture of FIG. 4B;

FIG. 4D is a schematic illustration of a second exemplary memory architecture according to the general architecture of FIG. 4B;

FIG. 4E is a schematic illustration of a third exemplary memory architecture according to the general architecture of FIG. 4B;

FIGS. 5A and 5B illustrate linear and non-linear implementations of an exemplary memory architecture, respectively, according to the present invention.

DETAILED DESCRIPTION OF THE INVENTION

Figure 1A:
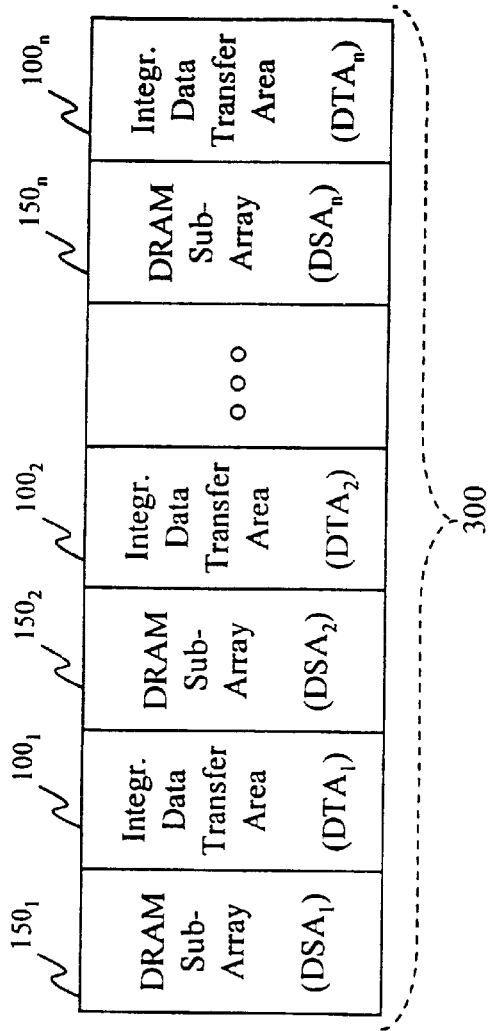
FIG. 1A is a schematic illustration of a memory architecture according to a first aspect of the present invention.

Referring now to the drawings, in which like reference numerals designate identical or corresponding parts throughout the several views, FIG. 1A is an illustration of one embodiment of an augmented DRAM 300 according to the present invention. The augmented DRAM device includes DRAM sub-arrays (1501 through 150n) and corresponding integrated data transfer areas (1001 through 100n). The term "integrated" is used herein to refer to data transfer areas that include integrated sense amplifiers as shown in more detail in FIG. 2. This is distinguishable from the data transfer area embodiments shown in FIGS. 4A–4E where the sense amplifiers are shown explicitly as separate elements (as will be described in greater detail below.) As would be appreciated by one of ordinary skill in the art, other circuitry (e.g., I/O buffers, refresh counters) has been omitted for the sake of clarity but would be included in a commercial augmented DRAM device—but outside of the data transfer area.

Figure 1B:
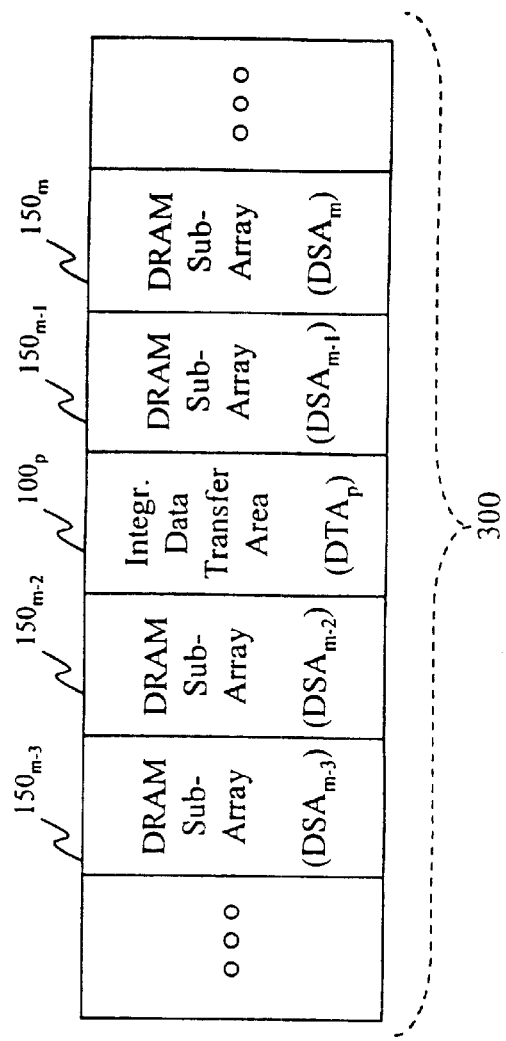
FIG. 1B is a schematic illustration of a memory architecture according to a second aspect of the present invention.

Similarly, FIG. 1B is an illustration of another embodiment of an augmented DRAM according to the present invention. The illustrated portion of the augmented DRAM device includes DRAM sub-arrays (150*m*-3 through 150*m*) and a corresponding integrated data transfer area 100*p* shared by plural DRAM sub-arrays. Similarly, as would be appreciated by one of ordinary skill in the art, other circuitry (e.g., I/O buffers and refresh counters) has been omitted for the sake of clarity but would be included in a commercial augmented DRAM device.

Figure 2:
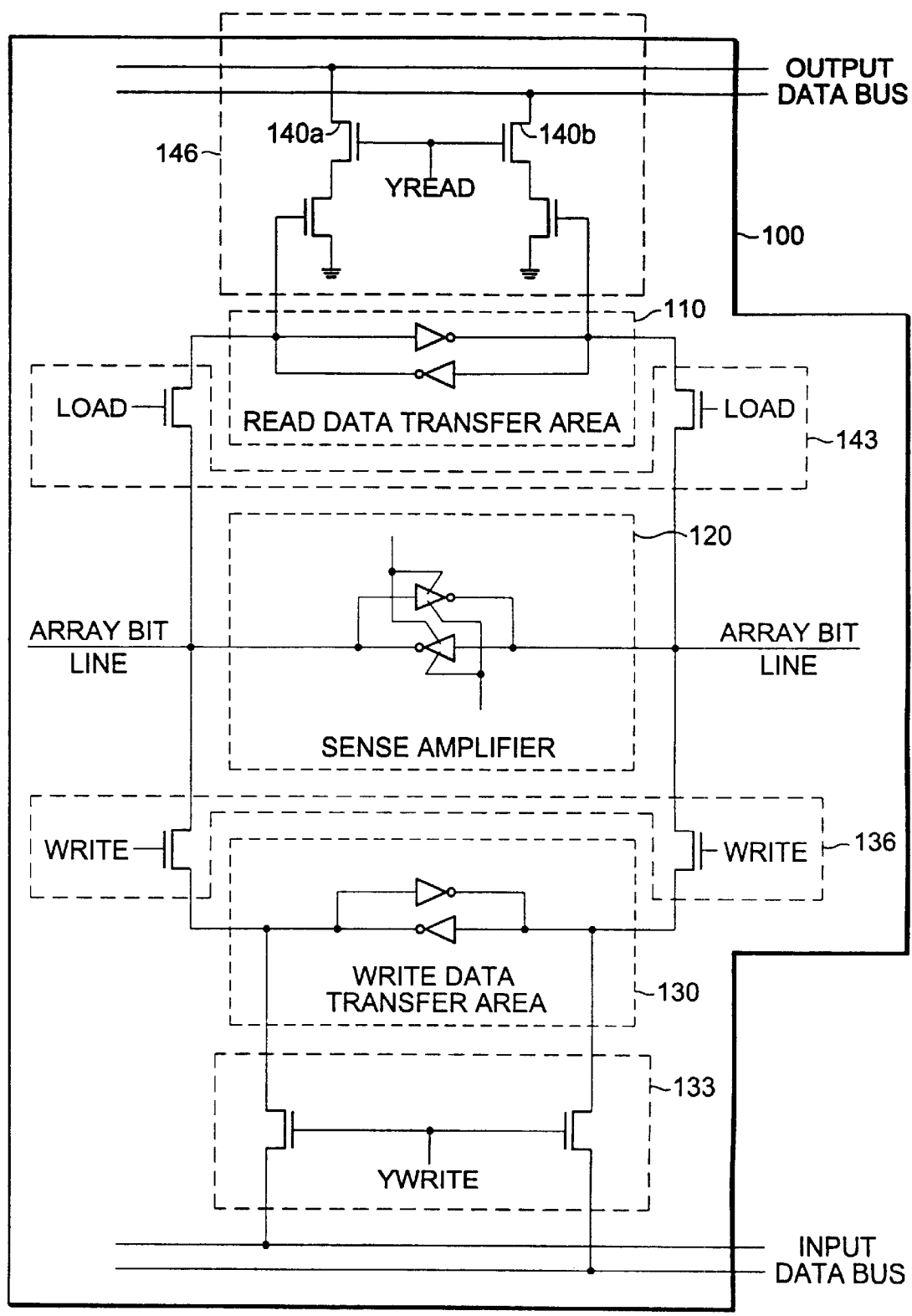
FIG. 2 is a schematic illustration of one bit of integrated read and write data transfer areas according for use with the memory architecture of FIG. 1.

Turning now to FIG. 2, a portion corresponding to a single bit of an exemplary integrated data transfer area 100 includes a read data transfer area 110, an integrated sense amplifier 120, and a write data transfer area 130. The general phrase "data transfer area" is intended to be limited to the area between the bit lines of at least one memory bank and either (1) the I/O drivers near the I/O pads of the memory device that carry address and data signals to/from the at least one memory bank or (2) the I/O pads directly in a memory device in which I/O drivers are not used. As used herein, the phrases "read data transfer area" and "write data transfer areas" are assigned special meanings. Both of the read data transfer area 110 and the write data transfer area 130 are single buffer areas (as opposed to the double buffer circuit of the '705 patent) that can be implemented as any one of a latch, a register or any other temporary storage device that can be written to using write control signals (e.g., the illustrated load and write signals). Although a pair of bit lines of a memory bank are typically connected at the center of a sense amplifier, the sense amplifiers are still nonetheless considered to be "between" the memory bank and the I/O connections. Thus, the "write data transfer area" 130 is the portion of the overall data transfer area that is between the first write isolators 133 and the second write isolators 136. Similarly, the "read data transfer area" 110 is the portion of the overall data transfer area that is between the first read isolators 143 and the second read isolators 146. Each of those isolators may be implemented as any one of, or as a combination of, an isolation transistor and a pass gate (and with or without associated drivers). As would be appreciated by one of ordinary skill in the art, the illustrated read and write data transfer areas are part of larger overall data transfer areas that are wider than a single bit and are designed to store the results of more than one transfer cycle of a burst. Generally though, the purpose of the Write Data transfer area 130 is to provide a temporary location wherein writes can be posted and then retired into a corresponding DRAM sub-array 150 at a later time. Generally, the data transfer areas store a row or a partial row (e.g., half of a row or a quarter of a row) of the DRAM sub-array.

Figure 3:
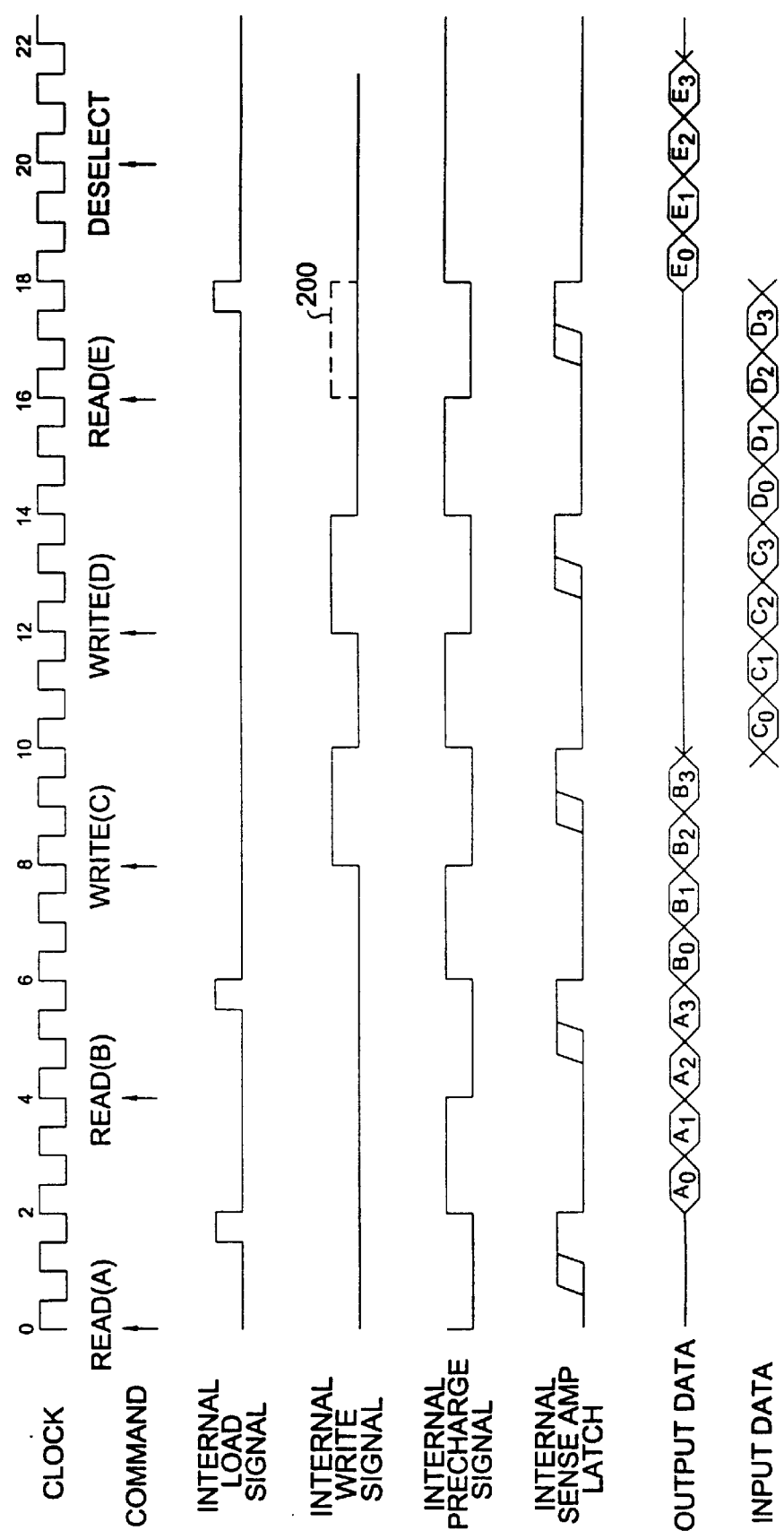
FIG. 3 is a timing diagram illustrating read and write timings according to one aspect of the present invention.

According to the present invention, data is read from and written to the data transfer areas 100 (e.g., using an exemplary timing shown in FIG. 3). In FIG. 3, the timing is provided for a synchronous interface with a command latency of 2 clocks for both read and write operations, an array access time of 2 clocks for read operation, an array pre-charge time of 2 clocks, and an array cycle time of 4 clocks. The timing example illustrates how the DRAM activity can be hidden behind back-to-back four word bursts, including read-to-write, read-to-read, and write-to-write transitions. However, as would be appreciated by one of ordinary skill in the art, the method and structure of the present invention can likewise be used with an asynchronous interface and with timings other than the clock cycles listed above.

The read cycle operation of this structure is essentially similar to that of the '317 patent discussed above. In FIG. 3, a command requesting a read from address "A" is issued at time "0". Based upon this read command, the array is immediately activated at a row indicated by address "A", and then, at some time prior to time "2", when the Sense Amplifiers are substantially loaded, the data from all or part of that row is loaded into the read data transfer areas by the pulse activation of the Load signal. The decoupling of the read data transfer areas from the corresponding DRAM sub-array (through isolation transistors 140*a* and 140*b* of the second read isolators 146) enable the DRAM sub-array to be pre-charged during clock periods "2" and "3." The DRAM sub-array is then ready to be reactivated at a row corresponding to address "B" by time "4." The second read cycle can then be executed in similar fashion starting at time "4" and completing its array precharge by time "8".

FIG. 3 also shows the timing for writing data into the Write Data transfer areas 130 during the page or burst write cycle. That data is then retired to the array at a later time—typically just prior to the next write cycle. In FIG. 3, a write cycle command is issued at time "8" to write data to address "C". Based upon this command, the array is immediately activated, not at the row indicated by address "C", but at the row indicated by the address associated with a previous write cycle (not shown). That address is stored in a Write Tag Register (not shown) coupled to the address lines of a corresponding DRAM sub-array 150. Then, at a point in time prior to time "10", and preferably prior to the activation of the Sense Amplifiers 120, the Write signal is activated so that the data from the Write Data transfer areas will be sensed by, or written into, the Sense Amplifiers 120 when the Sense Amplifiers 120 are subsequently loaded, thereby retiring the data in the Write Data transfer areas 130 to the appropriate array row (or the appropriate portion thereof). Once the Sense Amplifiers have been substantially loaded, and prior to the new data being written into the Write Data transfer areas 130 (at time "10") the Write signal is deactivated, thereby decoupling the Write Data transfer areas 130 from the memory sub-array 150 so that the sub-array 150 can be precharged (a time "10") and reactivated (at time "12") while the page or burst write data is being written to the Write Data transfer areas 130. As described above, the write address (in this case "C") must also be stored in a Write Tag Register so that the address ("C") can be supplied to the array when that data is retired from the Write Data transfer areas 130 into the sub-array 150.

FIG. 3 also shows that a second write cycle command is issued at time "12" to write data to address "D". Based upon this command, the sub-array corresponding to address "C" is immediately activated so that the data from the previous write command (initiated at time "8") can be retired to the array. Again, the appropriate Write signal is activated early in the array cycle, as described above, and is deactivated just prior to time "14" so that the C3 input data bit will be retired to the array 150, but the D0 data bit will be written to the Write Data transfer areas 130. The deactivation of the Write signal prior to time "14" will also allow the array to be pre-charged while the data associated with address "D" is written into the Write Data transfer areas, so that a new command can be issued at time "16".

In order to prevent reading "stale" data from a sub-array when the corresponding data transfer areas 100 includes the most recently written data, a comparison circuit is provided to compare the necessary portion of the requested read address to that stored in the Write Tag Register. If the comparison circuit determines that the appropriate portion of the two addresses matches, both the Write and Load signals would be activated in the same cycle, as indicated by the dashed line 200 on FIG. 3. For example, in the exemplary timing, if the row portion of the address requested at time "16" (address "E") matched the row portion of the address stored in the Write Tag Register (address "D"), then during the array cycle initiated at time "16", the appropriate Write signal would be activated prior to the activation of the DRAM sense amplifiers, and the appropriate Load signal would be activated following the activation of the DRAM sense amplifiers, so that the data would be retired from the Write Data transfer areas 130, and subsequently loaded into the Read Data transfer areas 110.

Figure 4A:
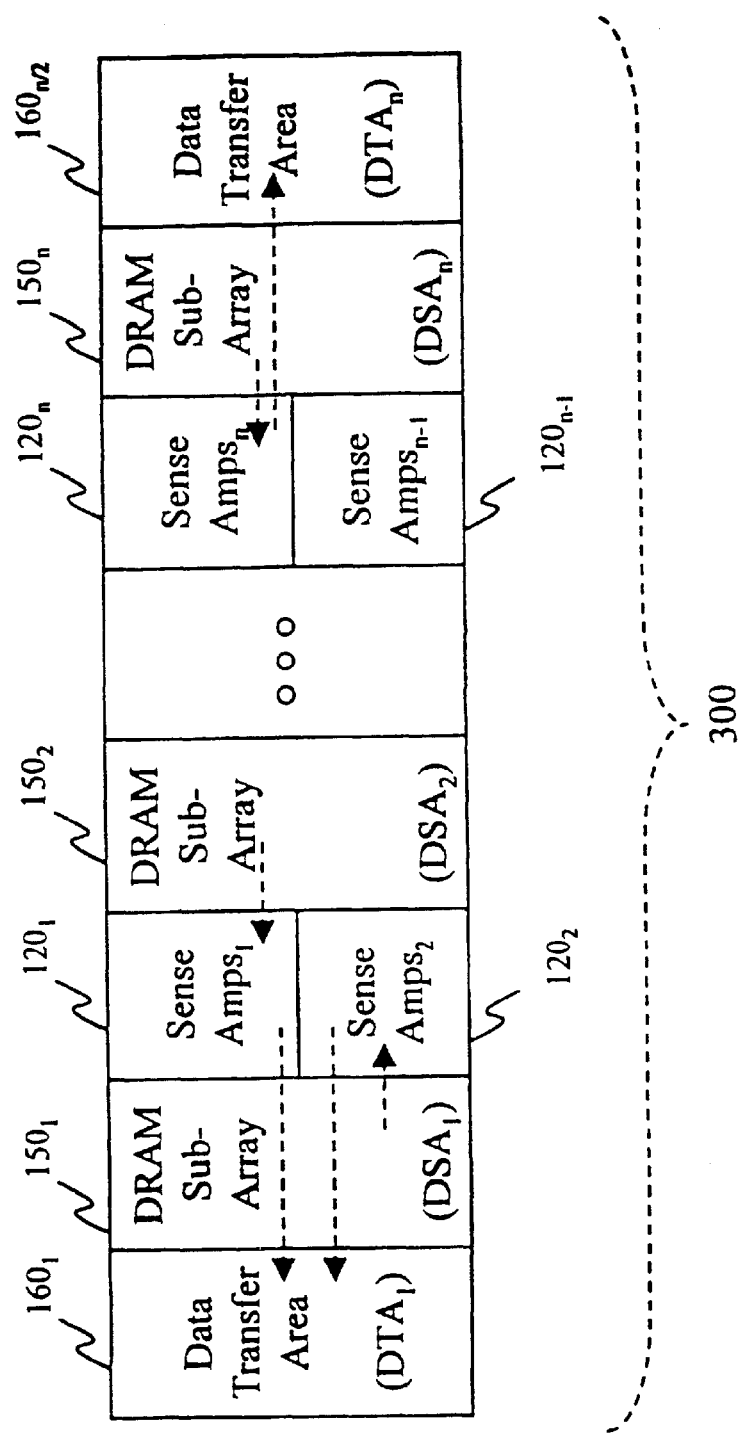
FIG. 4A is a schematic illustration of a memory architecture according to a third aspect of the present invention.

Although the above description has been given in terms of data transfer areas with integrated sense amplifiers, the memory architecture of the present invention is not limited to the architecture of FIGS. 1A and 1B. As shown in FIG. 4A, the sense amplifiers can be separated from the data transfer areas so that plural sense amplifiers can share a single data transfer area 160.

The memory architecture of the present invention in which the sense amplifiers are not integrated into the data transfer areas is generally shown in FIG. 4B. The relationship between bits in the data transfer areas and bits in the sense amplifiers can be any one of: one-to-one, one-to many, many-to-one, and many-to-many. Similarly, the relationship between bits in the sense amplifiers and bits in the rows of DRAM sub-arrays can be any one of: one-to-one, one-to many, many-to-one, and many-to-many. For example, as shown in FIG. 4C, multiple sense amplifier bits can share access to a single bit in a Read/Write data transfer area (e.g., by using multiple Write and Load gates, gated by multiple Write and Load signals). Similarly, as shown in FIG. 4D, a single bit of a portion of a DSA (e.g., on bit of a row or half row) may be accessed by one of plural sense amplifier bits before being written to a shared bit in a DTA.

As shown in FIG. 4E, plural data transfer area bits may also be used if plural rows (or row portions) are to be stored simultaneously for a corresponding DRAM sub-array. In such an embodiment, the "tag" portion of the addresses stored in the data transfer area must be stored for each portion stored in the data transfer area. (In an embodiment in which plural DSAs share plural DTAs, the tag portions must indicate to which DSA the data belongs.)

Figures 1, 4F:
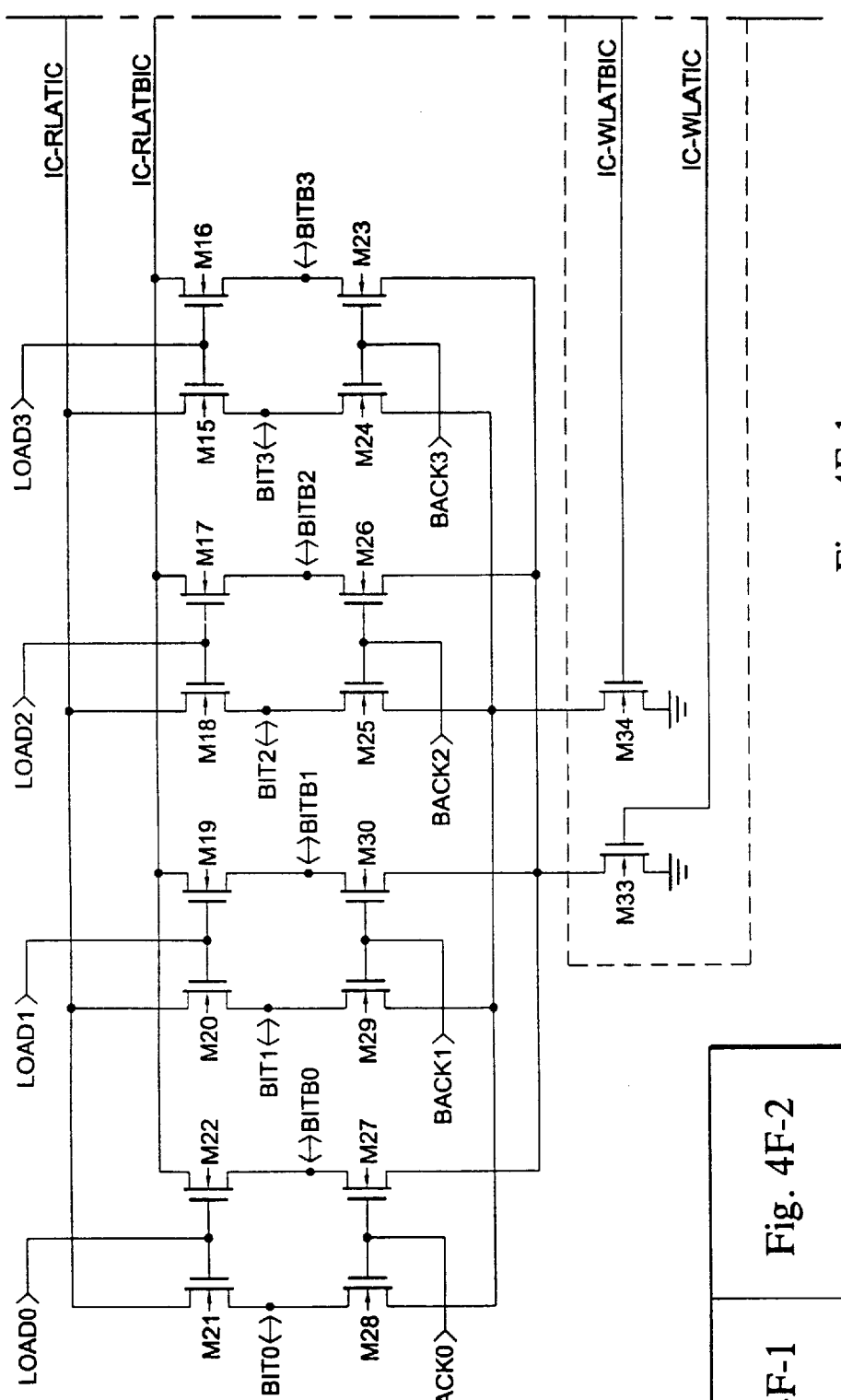
FIG. 4F is a schematic illustration of a shared sense amplifier memory architecture in which additional support circuitry is shown.
Figures 2, 4F:
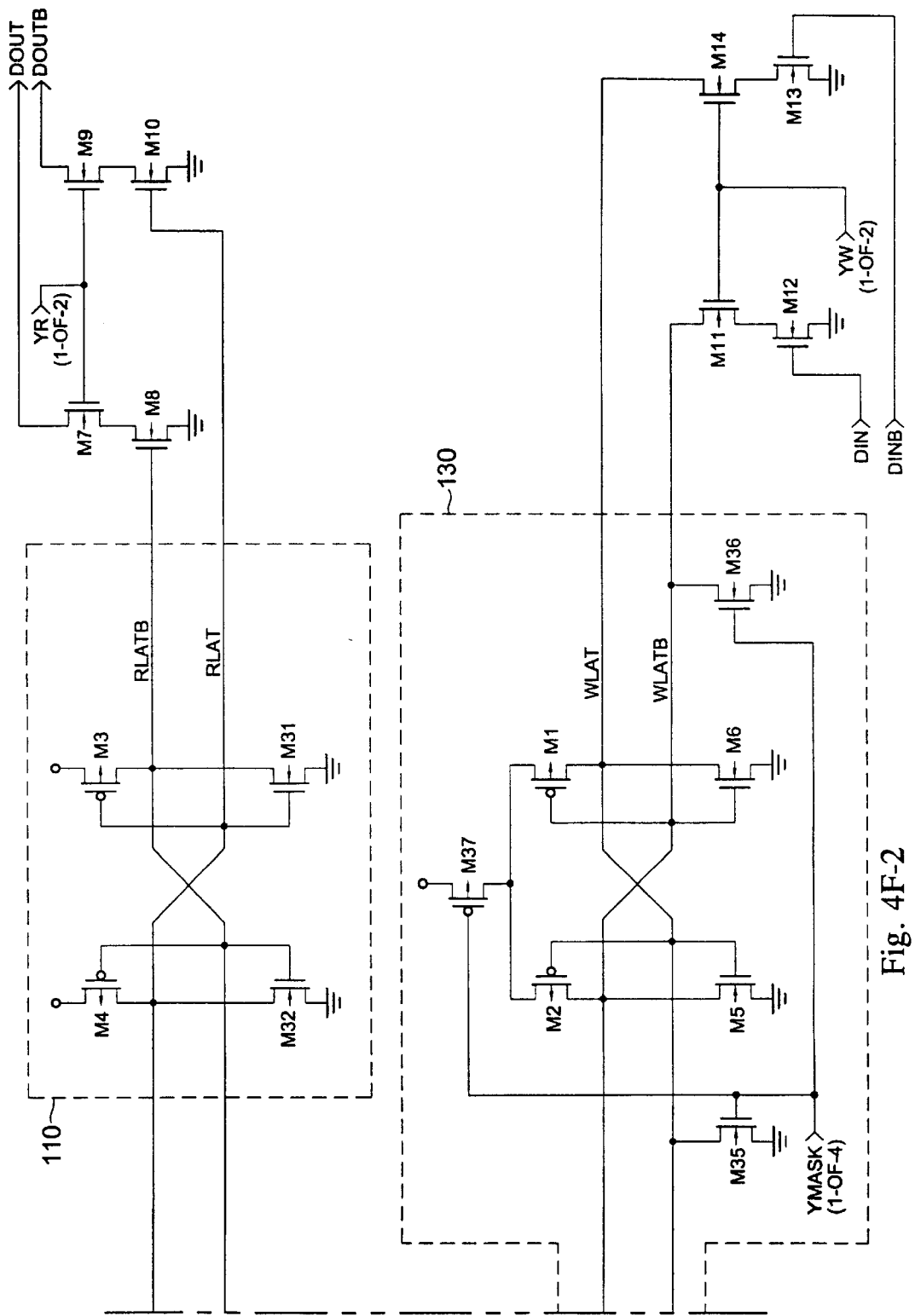

FIG. 4F illustrates additional support circuitry for use with the read and write data transfer areas according to one aspect of the present invention. The Row Register/Register Data Mux circuit is shared between four DRAM sense amplifiers, which are staggered, such that RREG can be built on a 16 bit pitch. The LOAD and BACK signals are generated in the region between sense amplifier bands, and run vertically through the band. The YR, YW, and YMASK signals each represent two bits of a 1-of-4 decoder output running vertically through the sense amplifier band. Each YR and YW signal is connected to eighteen RREG's (per row driver section) in a given SAMP band, allowing each band to support two burst addresses for all of the eighteen DOUT/DIN pairs which run horizontally across the array on Metal-2. Each YMASK signal is connected to nine RREG's in a row driver section, allowing for independent masking of the two DIN bytes.

In the write data transfer area 130 of FIG. 4F, a pair of transistors (M33 and M34) act as unclocked drivers for driving the value held in the cross-coupled inverters. The driven value is isolated from the corresponding pair of bit lines (using transistors M23–M28) until the corresponding BACK signal (labeled "Write" in FIG. 2) is activated. Once one of the transistor pairs is activated, the driven value is applied to a corresponding pair of bit lines and subsequently driven to a corresponding pair of sense amplifiers.)

Furthermore, the data transfer areas bits need not necessarily be located physically close to the sense amplifiers. Although it may be advantageous to co-locate sense amplifiers and data transfer areas, avoiding co-location enhances design flexibility.

Although the above-embodiments have been illustrated as linear arrays of elements (i.e., SAs, DTAs, and DSAs in a linear layout), as shown in FIG. 5A, other embodiments are possible. As shown in FIG. 5B, the linear elements can be repeated in plural rows such that an increased number of DSAs can be included in a hybrid memory device.

Although the above description has been provided in terms of pairs of bit lines, one of ordinary skill in the art would appreciate from this specification that data need not be stored in the sub-arrays in complementary form. Instead, bits can be stored in single capacitors in the sub-array and a dummy bit line can be used to determine if the value read from the sub-array is a one or a zero.

Obviously, numerous modifications and variations of the present invention are possible in light of the above teachings. It is therefore to be understood that, within the scope of the appended claims, the invention may be practiced otherwise than as specifically described herein. For example, a variety of configurations could be used to couple either separate or common I/O busses to the Read Data and Write Data transfer areas bits, or the Data transfer areas latches could be implemented in any of a variety of fashions, without altering the basic nature or operation of the invention.

What is claimed is:

1. A memory device comprising:
a dynamic memory sub-array for storing data;
a pair of bit lines coupled to the dynamic memory sub-array for storing values into and reading values from the dynamic memory sub-array;
an input data bus;
a first write isolator coupled to the input data bus for blocking data from the input data bus when the memory device is not in a write mode;
an independently maskable single buffer write data transfer area coupled to the first write isolator for temporarily storing a value before applying the value to the pair of bit lines comprising a pair of cross-coupled inverters and a pair of transistors including control terminals driven by outputs of the cross-coupled inverters; and
a second write isolator coupled to the write data transfer area for blocking the pair of bit lines from overriding the value in the write data transfer area, wherein the write data transfer area is directly connected between the first and second write isolators.

2. The memory device as claimed in claim 1, wherein the second write isolator comprises a pair of isolation transistors.

3. The memory device as claimed in claim 1, wherein the first write isolator comprises a pair of isolation transistors.

4. The memory device as claimed in claim 1, further comprising a sense amplifier for sensing at least one bit value read from the dynamic memory sub-array and driving the pair of bit lines.

5. The memory device as claimed in claim 1, further comprising:
   a read data transfer area;
   a first read isolator coupled between the read data transfer area and the bit lines for isolating the read data transfer area from the pair of bit lines;
   an output data bus; and
   a second read isolator coupled between the first read data isolator and the output data bus for isolating the read data transfer area from the output bus, wherein the read data transfer register is directly coupled between the first and second read isolators.

6. The memory device as claimed in claim 5, further comprising a sense amplifier for sensing at least one bit value read from the dynamic memory sub-array and driving the pair of bit lines.

7. The memory device as claimed in claim 5, wherein the second read isolator comprises a pair of isolation transistors.

8. The memory device as claimed in claim 5, wherein the first read isolator comprises a pair of isolation transistors.

9. The memory device as claimed in claim 1, wherein the write data transfer area comprises:
   a pair of cross-coupled inverters including a first inverter and a second inverter each having an input and an output;
   a first N-channel transistor coupled to the output of the first inverter having a gate for receiving a mask control signal;
   a second N-channel transistor coupled to the output of the second inverter having a gate for receiving the mask control signal;
   a P-channel transistor coupled to a power terminal of the first and second inverters having a gate for receiving the mask control signal; and
   first and second unclocked N-channel transistors coupled to the outputs of the first and second inverters.

10. A memory device comprising:
    a dynamic memory sub-array for storing data;
    a pair of bit lines coupled to the dynamic memory sub-array for storing values into and reading values from the dynamic memory sub-array;
    an input data bus;
    a first write isolator coupled to the input data bus for blocking data from the input data bus when the memory device is not in a write mode;
    an independently maskable single buffer write data transfer area coupled to the first write isolator for temporarily storing a value before applying the value to the pair of bit lines comprising a pair of cross-coupled inverters including a first inverter and a second inverter each having an input and an output, a first N-channel transistor coupled to the output of the first inverter having a gate for receiving a mask control signal, a second N-channel transistor coupled to the output of the second inverter having a gate for receiving the mask control signal, a P-channel transistor coupled to a power terminal of the first and second inverters having a gate for receiving the mask control signal, and first and second unclocked N-channel transistors coupled to the outputs of the first and second inverters; and
    a second write isolator coupled to the write data transfer area for blocking the pair of bit lines from overriding the value in the write data transfer area, wherein the write data transfer area is directly connected between the first and second write isolators.

11. The memory device as claimed in claim 10, wherein the second write isolator comprises a pair of isolation transistors.

12. The memory device as claimed in claim 10, wherein the first write isolator comprises a pair of isolation transistors.

13. The memory device as claimed in claim 10, further comprising a sense amplifier for sensing at least one bit value read from the dynamic memory sub-array and driving the pair of bit lines.

14. The memory device as claimed in claim 10, further comprising:
    a read data transfer area;
    a first read isolator coupled between the read data transfer area and the bit lines for isolating the read data transfer area from the pair of bit lines;
    an output data bus; and
    a second read isolator coupled between the first read data isolator and the output data bus for isolating the read data transfer area from the output bus, wherein the read data transfer register is directly coupled between the first and second read isolators.

15. The memory device as claimed in claim 14, further comprising a sense amplifier for sensing at least one bit value read from the dynamic memory sub-array and driving the pair of bit lines.

16. The memory device as claimed in claim 14, wherein the second read isolator comprises a pair of isolation transistors.

17. The memory device as claimed in claim 14, wherein the first read isolator comprises a pair of isolation transistors.

* * * * *